United States Patent
Li et al.

(10) Patent No.: US 7,509,186 B2
(45) Date of Patent: Mar. 24, 2009

(54) METHOD AND SYSTEM FOR REDUCING THE VARIATION IN FILM THICKNESS ON A PLURALITY OF SEMICONDUCTOR WAFERS HAVING MULTIPLE DEPOSITION PATHS IN A SEMICONDUCTOR MANUFACTURING PROCESS

(75) Inventors: Yue Li, Hopewell Junction, NY (US); Gary W. Behm, Hopewell Junction, NY (US); James V. Iannucci, Jr., Wappingers Falls, NY (US); Derek C. Stoll, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 308 days.

(21) Appl. No.: 11/557,134

(22) Filed: Nov. 7, 2006

(65) Prior Publication Data

US 2008/0124818 A1    May 29, 2008

(51) Int. Cl.
G06F 19/00 (2006.01)
H01L 21/66 (2006.01)

(52) U.S. Cl. .......... 700/121; 700/115; 257/E21.53; 451/5

(58) Field of Classification Search .......... 700/121, 700/164, 115, 116; 257/E21.53, E21.525; 451/5; 438/692
See application file for complete search history.

(56) References Cited

U.S. PATENT DOCUMENTS

| 6,410,351 | B1 | 6/2002 | Bode et al. |
| 6,587,744 | B1 | 7/2003 | Stoddard et al. |
| 6,708,129 | B1 | 3/2004 | Pasadyn et al. |
| 6,857,938 | B1 | 2/2005 | Smith et al. |
| 6,965,808 | B1 | 11/2005 | Conrad et al. |
| 6,988,017 | B2 | 1/2006 | Pasadyn et al. |
| 2002/0199082 | A1* | 12/2002 | Shanmugasundram et al. .......... 712/208 |
| 2003/0014145 | A1* | 1/2003 | Reiss et al. .......... 700/121 |
| 2003/0049376 | A1* | 3/2003 | Schwarm et al. .......... 427/255.28 |

(Continued)

OTHER PUBLICATIONS

Doscher, et al., Computer Integrated Manufacturing (CIM) Framework Specification Version 2.0, SEMATECH, Technology Transfer 93061697J-ENG, Jan. 31, 1998.

Mullins, et al., Advanced Process Control Framework Initiative (APCFI) 1.0 Specifications, SEMATECH, Technology Transfer 97063300A-ENG, Jun. 30, 1997.

(Continued)

*Primary Examiner*—Albert DeCady
*Assistant Examiner*—Steven R Garland
(74) *Attorney, Agent, or Firm*—Rosa S. Yaghmour; Howard Cohn

(57) ABSTRACT

A method and system for reducing the variation in film thickness on a plurality of semiconductor wafers having multiple deposition paths in a semiconductor manufacturing process is disclosed. A film of a varying input thickness is applied to semiconductor wafers moving through various film deposition paths. The deposition path of each of the semiconductor wafers is recorded. A subset of semiconductor wafers is measured and an average film input thickness corresponding to each of the film deposition paths is calculated. If semiconductor wafer in the specific film deposition path does not have measurement data, by default it uses historical measurement data. The average film input thickness of the deposition path corresponding to a given semiconductor wafer is then used to modify the recipe of a process tool, such as a Chemical Mechanical Planarization (CMP) Process Tool. An improved manufacturing process is achieved without the use of excess measurements.

20 Claims, 4 Drawing Sheets

U.S. PATENT DOCUMENTS

2003/0049390 A1* 3/2003 Shanmugasundram et al. .................. 427/585
2004/0148049 A1 7/2004 Schwarm
2004/0267399 A1 12/2004 Funk
2005/0288810 A1 12/2005 Lin et al.

OTHER PUBLICATIONS

Advanced Process Control Framework Initiative (APCFI), Sematech, Jun. 30, 1997.
Computer Integrated Manufacturing (CIM) Framework Specification Version 2.0, Sematech, Jan. 31, 1998.

* cited by examiner

METHOD AND SYSTEM FOR REDUCING THE VARIATION IN FILM THICKNESS ON A PLURALITY OF SEMICONDUCTOR WAFERS HAVING MULTIPLE DEPOSITION PATHS IN A SEMICONDUCTOR MANUFACTURING PROCESS

FIELD OF THE INVENTION

The present invention relates generally to semiconductor manufacturing, and, more particularly, to a method and apparatus for consistently making a film of a desired thickness on a semiconductor wafer in a manufacturing process flow.

BACKGROUND

In the manufacture of semiconductor devices, semiconductor wafers, such as silicon semiconductor wafers, are subjected to a number of processing steps. One such process step includes the depositing or forming of layers on the silicon semiconductor wafer. One such process used to form the layers is known as chemical vapor deposition (CVD), wherein reactive gases are introduced into a chamber, e.g., a CVD process tool, containing the semiconductor wafers. The reactive gases facilitate a chemical reaction that causes a layer to form on the semiconductor wafers. One exemplary deposition process is the formation of polysilicon by reacting nitrogen (N.sub.2) and silane (SiH.sub.4) in a furnace. Various types of CVD process tools may be used. For example, the CVD process tool may be an atmospheric-pressure (AP) CVD process tool, a low-pressure (LP) CVD process tool, or a plasma-enhanced CVD process tool.

There are many factors that affect the deposition rate of a deposition tool. These factors include, among other things, the flow rate of reactive gases through the chamber and the temperature of the chamber. Typically, to determine the deposition rate for a particular tool (e.g., when it is first placed in service or after a maintenance event), a series of qualification semiconductor wafers are processed and the resultant thickness of the process layer is measured. The measurements are used to estimate the deposition rate of the tool. Deposition times for subsequently processed semiconductor wafers are determined based on the anticipated deposition rate. Normal variations in temperature and reactant flow rate may cause a deviation in the deposition rate from the anticipated rate, causing the process to exceed a control limit.

The CVD tool deposits a film (layer) onto a semiconductor wafer. Typically, when the semiconductor wafer leaves the CVD tool, the film exceeds the desired target final thickness. To reduce the film to the desired target thickness, the semiconductor wafer is then fed to a CMP (Chemical Mechanical Planarization) process tool. This process tool "polishes" the film to remove a portion of the film, making it thinner, so that the film is the desired thickness when it exits the CMP process tool.

For the purposes of this disclosure, the thickness of the film on a semiconductor wafer when it is input to the CMP process tool is referred to as the "input thickness." The desired thickness of the film when it exits the CMP process tool is referred to as the "desired thickness." The actual thickness of the film when it exits the CMP process tool is referred to as the "final thickness." An ideal goal of the semiconductor manufacturing process is that the final thickness is equal to the desired thickness. In a practical sense, the final thickness should be within a predefined tolerance of the desired thickness.

It is desirable to have extremely repeatable manufacturing processes for semiconductor devices. Therefore it is necessary to minimize the variation in the thickness of the film during the manufacturing process. E.g., a batch of semiconductor wafers made two months ago should ideally be identical to a batch of semiconductor wafers made yesterday.

In an effort to produce consistent film thickness on each semiconductor wafer, the input thickness is periodically measured on a sampling of semiconductor wafers after they leave the CVD process tool. This generates a "running average" thickness. This average thickness data is fed to the CMP process tool. The CMP process tool, assuming this average thickness to be the input thickness of the film on a particular semiconductor wafer, can calculate the appropriate polish time, thereby attempting to achieve the desired thickness when the semiconductor wafer exits the CMP process tool.

The above method does not yield optimal results. This is because semiconductor wafers are only periodically sampled as they leave the CVD process tool to monitor input thickness. There is a desire to minimize the number of wafers sampled because measurement is considered to be a manufacturing overhead, and causes decreased manufacturing throughput. However, some measurement is necessary because there can be considerable variation in the thickness of the film as it leaves the CVD process tool. A prime reason for this variation is that the CVD process tool typically has multiple chambers. These chambers may have slightly different operating temperatures, which causes variations in semiconductor wafers, depending on what chamber they were in when the film was deposited.

Referring now to FIG. 1, a prior art Film Deposition and Polish process system 100 is shown. The system comprises at least one CVD (Chemical Vapor Deposition) Process Tool 104, a CMP Process Tool 106, a Measurement Tool 110, a Data Management System 112, and a CMP R2R (Chemical Mechanical Planarization Run-to-Run) Controller 114. In the block diagrams of this disclosure, the flow of semiconductor wafers is indicated by the wide arrows denoted W1, W2, W3, and W4. Thin solid arrows (122,124,126, and 128) indicate data communication links between the various devices.

CVD Process Tool 104 uses Chemical Vapor Deposition techniques that are well known in the industry to apply a film to a surface of a semiconductor wafer. A majority of semiconductor wafers (not shown) leave the CVD Process Tool 104, and proceed directly to the CMP Process Tool 106 via path W1. The thickness of the film on the semiconductor wafers when they are input to the CMP process tool 106 is referred to as the input thickness. The CMP Process Tool 106 removes a portion of the film that was applied with the CVD Process Tool 104 to achieve a final thickness. In order to compensate for variations in input thickness, a portion of the semiconductor wafers that exit the CVD Process Tool 104 travel via path W2 to a Measurement Tool 110. The Measurement Tool 110 measures the input thickness of the film on a sampling of semiconductor wafers. As mentioned previously, due to throughput considerations, it is usually not practical to send all semiconductor wafers via path W2 to the Measurement Tool 110. Only a portion of the semiconductor wafers are sent. For example, every fourth semiconductor wafer might be sent to Measurement Tool 110, with all other semiconductor wafers proceeding directly to CMP Process Tool 106. After a semiconductor wafer leaves Measurement Tool 110, it proceeds via path W3 back to the manufacturing path to enter the CMP Process Tool 106. When the CMP Process is complete, semiconductor wafers exit the CMP Process Tool 106 via path W4. The goal is to have the final thickness of the film of the semiconductor wafers exiting the CMP Process Tool 106 at the desired thickness.

The Measurement Tool 110 sends the measured film input thickness data to a Data Management System 112 via data communication link 122. Data Management System 112 may be comprised of a computer having data acquisition means, network communication means, and data storage means, as is well known in the industry. The Data Management System 112 may also have a general purpose microprocessor that executes software to analyze the data supplied via Measurement Tool 110. In one case, the data analysis may comprise calculating a running average of film input thickness. It is possible that the Data Management System 112 is integrated with the CMP R2R Controller 114.

The CMP R2R Controller 114 is a factory automation controller that receives input from Data Management System 112 via data communication link 124. CMP Process Tool 106 preferably has an Integrated Measurement system 108 that measures the final thickness of the film on a sample of the semiconductor wafers that have undergone the CMP process. This information is also fed to Data Management System 112 via data communication link 126. The final thickness measurements are used to monitor the CMP process to ensure it is within acceptable limits. The Data Management System 112 supplies the final thickness to a CMP R2R Controller 114 via data communication link 124. The CMP R2R Controller uses the data received from the Data Management System 112 to compute appropriate parameter values for the remaining semiconductor wafers on the CMP Process Tool 106. The appropriate parameter values are sent from the CMP R2R Controller 114 to the CMP Process Tool 106 via data communication link 128, and override the existing parameter values that were specified in the tool process recipe. The tool process recipe contains a list of parameters with values for a specific process operation. The parameters may include, but are not limited to, the polishing time, polishing rate, down force, slurry particle size, pH of the slurry, back pressure, and slurry flow rate of the CMP Process Tool 106. Having an accurate film input thickness is essential for fine tuning the recipe of the CMP Process Tool 106.

The average film input thickness is an approximation that is intended to be representative of the input film thickness of a given semiconductor wafer that is entering the CMP Process Tool 106. However, the method for calculating and using average film input thickness of the system 100 shown in FIG. 1 has some shortcomings. It does not account for variations amongst different CVD Process Tools. For example, while only on CVD Process Tool 106 was shown, it is often desirable to use multiple CVD Process Tools in a high-volume manufacturing operation. Furthermore, within each CVD Process Tool, there are typically multiple semiconductor wafer processing chambers, providing for simultaneous processing of more than one semiconductor wafer. Each processing chamber within a particular CVD Process Tool has its own slight variation as compared with other processing chambers within a CVD Process Tool. The system 100 of FIG. 1 does not take this variation into account. Therefore, the running average film input thickness is not an optimal representation of the film input thickness of a particular semiconductor wafer. It is desirable to improve accuracy of the average film input thickness without requiring additional measurements that would slow down production and reduce throughput of the manufacturing line.

CMP R2R Controller 114 may use standard factory automation methods for semiconductor manufacturing, such as the Advanced Process Control (APC) Framework. CIM (SEMI E81-0699-Provisional Specification for CIM Framework Domain Architecture) and APC (SEMI E93-0999-Provisional Specification for CIM Framework Advanced Process Control Component) specifications are publicly available from SEMI (The Semiconductor Equipment and Materials Institute, commonly known as SEMI, is an organization headquartered in San Jose, Calif., that publishes various specifications for the semiconductor industry). The APC is a preferred platform from which to implement the control strategy taught by the present invention. In some embodiments, the APC can be a factory-wide software system; therefore, the control strategies taught by the present invention can be applied to virtually any of the semiconductor manufacturing tools on the factory floor. The APC framework also allows for remote access and monitoring of the process performance. Furthermore, by utilizing the APC framework, data storage can be more convenient, more flexible, and less expensive than local drives. The APC platform allows for more sophisticated types of control because it provides a significant amount of flexibility in writing the necessary software code. These methods are well known in the industry, and are disclosed in U.S. Pat. No. 6,708,129 (entitled "Method and apparatus for semiconductor wafer-to-semiconductor wafer control with partial measurement data") which is herein incorporated by reference in its entirety.

For maximum process control, it would be ideal to measure the input thickness of the film on every semiconductor wafer being fed to the CMP process tool. However, this is not practical due to the time it takes to perform this measurement. Therefore, what is needed is an improved method that increases the accuracy of the film thickness information supplied to the CMP process tool, without causing excessive slowdown in the manufacturing throughput.

SUMMARY OF THE INVENTION

According to the present invention, there is disclosed a method for reducing the variation in film thickness on a plurality of semiconductor wafers having multiple deposition paths in a semiconductor manufacturing process. The method comprises the following steps: applying a film of a varying input thickness to the plurality of semiconductor wafers moving through a plurality of film deposition paths; recording the deposition path of each of the plurality of semiconductor wafers; measuring the input thickness of the film on selected semiconductor wafers passing through each of the plurality of film deposition paths; calculating an average film input thickness corresponding to each of the plurality of film deposition paths; calculating process tool parameters for each semiconductor wafer corresponding to the average film input thickness of the film deposition path of that semiconductor wafer; and reducing the input film thickness on each semiconductor wafer to its final film thickness corresponding to a desired film thickness using the process tool parameter calculated for that semiconductor wafer.

Further according to the present invention, the method includes the step of applying a film of a predetermined input thickness to the plurality of semiconductor wafers is with a CVD process tool having a plurality of film deposition paths.

Still further according to the present invention, the method includes the step of applying a film is with one or more CVD process tool having a plurality of chambers, each representing a film deposition path, with different operating temperatures that cause variations in the input film thickness of the semiconductor wafers, depending on which chamber they were in when the film was deposited.

Also according to the present invention, the method includes the step of recording the deposition path includes recording the one or more CVD Process Tools and chamber within that tool from which a particular semiconductor wafer originated.

Yet further according to the present invention, the step of calculating process tool parameters is calculating chemical mechanical planarization process tool parameters for each semiconductor wafer.

Further according to the present invention, the step of reducing the input film thickness to final film thickness on each semiconductor wafer is performed by chemical planarization on each semiconductor wafer using the chemical mechanical planarization tool operated according to the calculated chemical mechanical planarization process tool parameter for that particular semiconductor wafer.

Further according to the present invention, the step of reducing the input film thickness to its final thickness on each semiconductor wafer is by polishing each semiconductor wafer using the chemical mechanical planarization process tool parameter for that particular semiconductor wafer.

Further according to the present invention, the step of measuring the thickness of the input film on selected semiconductor wafers passing through each of the plurality of film deposition paths includes sending the selected semiconductor wafers to a measurement tool.

Further according to the present invention, the step of recording the deposition path of the semiconductor wafer includes denoting a specific chemical vapor deposition tool, and a particular chamber within the specific chemical vapor deposition tool.

Yet further according to the present invention, the step of calculating an average film input thickness corresponding to each deposition path comprises calculating a windowed average based on the film input thickness of a last preselected number of semiconductor wafers.

Yet further according to the present invention, the step of calculating an average film input thickness corresponding to each deposition path comprises calculating a weighted average based on the film input thickness of a preselected number of semiconductor wafers and wherein a group of the semiconductor wafers closest to the last measured is more highly weighted in the average than the remainder of the preselected number of semiconductor wafers.

Still further according to the present invention, the method further comprises the steps of: measuring the final thickness; and calculating process tool parameters for each semiconductor wafer corresponding to the average film input thickness of the film deposition path of that semiconductor wafer and the final thickness for semiconductor wafers having the same film deposition path. If semiconductor wafer in the specific film deposition path does not have measurement data, by default it uses historical measurement data.

Also further according to the present invention, there is disclosed a system for reducing the variation in film thickness on a plurality of semiconductor wafers having multiple deposition paths in a semiconductor manufacturing process, comprising: at least one process tool for applying a film of a varying input thickness to the plurality of semiconductor wafers moving through a plurality of film deposition paths; a data processing system recording the deposition path of each of the plurality of semiconductor wafers; a measurement device for measuring the input thickness of the film on selected semiconductor wafers passing through each of the plurality of film deposition paths; means for calculating an average film input thickness corresponding to each of the plurality of film deposition paths; means for calculating process tool parameters for each semiconductor wafer corresponding to the average film input thickness of the film deposition path of that semiconductor wafer; and means for reducing the input film thickness on each semiconductor wafer to its final film thickness corresponding to a desired film thickness using the process tool parameter calculated for that semiconductor wafer.

Still further according to the present invention, the system incorporates a CVD process tool having a plurality of film deposition paths.

Still further according to the present invention, the CVD process tool has a plurality chambers, each representing a film deposition path, with different operating temperatures that cause variations in the input film thickness of the semiconductor wafers, depending on which chamber they were in when the film was deposited.

Still further according to the present invention, the means for calculating process tool parameters is a chemical mechanical planarization run-to-run controller.

Still further according to the present invention, the means for reducing the input film thickness to final film thickness on each semiconductor wafer is a chemical mechanical planarization tool operated according to the calculated chemical mechanical planarization process tool parameter for that particular semiconductor wafer.

Still further according to the present invention, both the means for calculating an average film input thickness corresponding to each of the plurality of film deposition paths and the means for calculating process tool parameters for each semiconductor wafer corresponding to the average film input thickness of the film deposition path of that semiconductor wafer is the chemical mechanical planarization run-to-run controller.

Yet further according to the present invention, the means for recording a deposition path specific film input thickness comprises a data management system.

Still further, the chemical mechanical planarization process tool has an integrated measurement module for measuring the final film thickness and sending the final film thickness to the data management system whereby the process tool parameters calculated for each semiconductor wafer correspond to the average film input thickness of the film deposition path of that semiconductor wafer and the final thickness for semiconductor wafers having the same film deposition path.

BRIEF DESCRIPTION OF THE DRAWINGS

The structure, operation, and advantages of the present invention will become further apparent upon consideration of the following description taken in conjunction with the accompanying figures (FIGS.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity. Block diagrams may not illustrate certain connections that are not critical to the implementation or operation of the present invention, for illustrative clarity.

Figure 1:
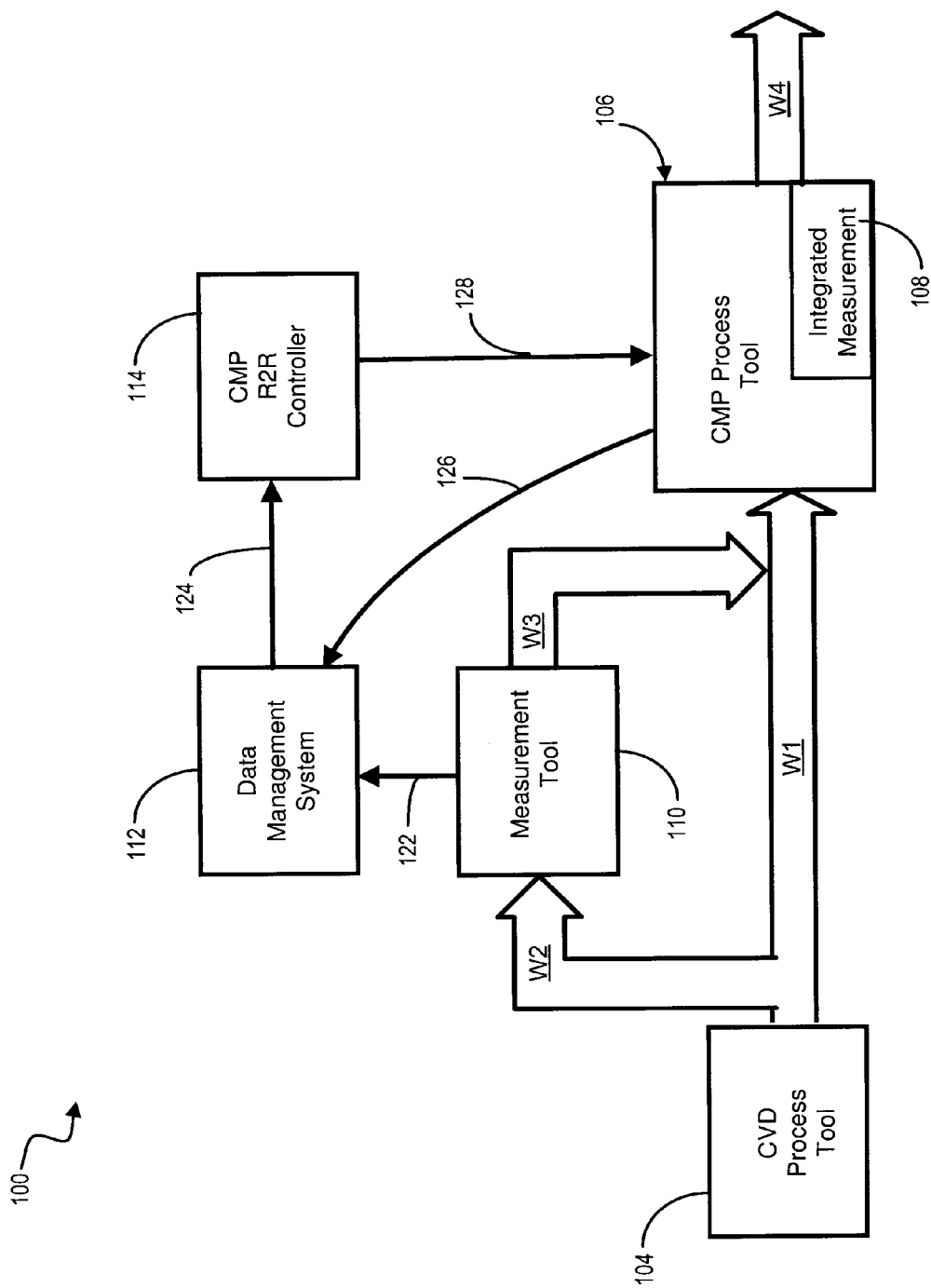

In the drawings accompanying the description that follows, often both reference numerals and legends (labels, text descriptions) may be used to identify elements. If legends are provided, they are intended merely as an aid to the reader, and should not in any way be interpreted as limiting.

Often, similar elements may be referred to by similar numbers in various figures (FIGs) of the drawing, in which case typically the last two significant digits may be the same, the most significant digit being the number of the drawing figure (FIG).

FIG. 1 shows a block diagram of a prior art Film Deposition and Polish process system.

Figure 2:
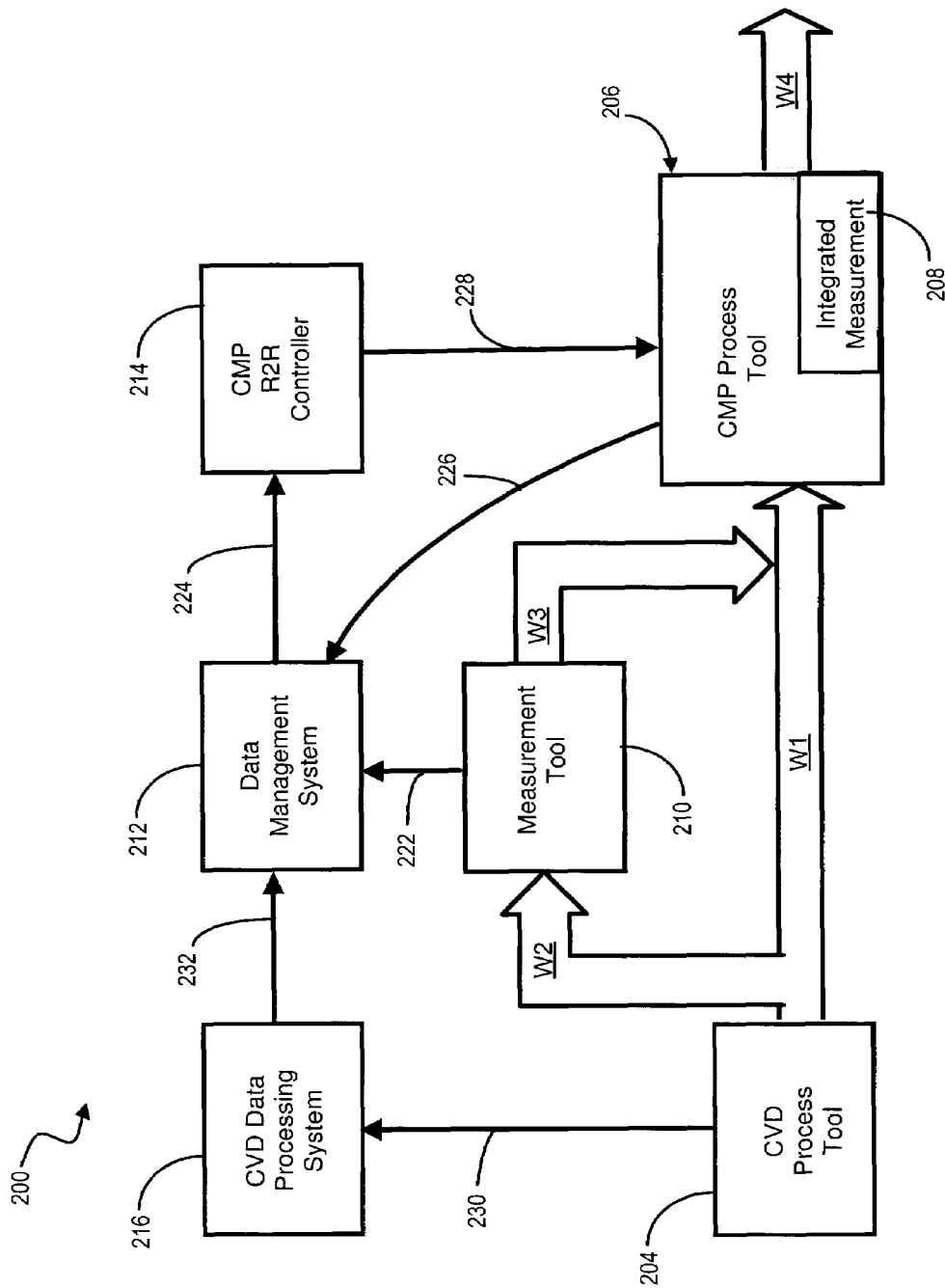

FIG. 2 shows a block diagram of the system of the present invention.

Figure 3:
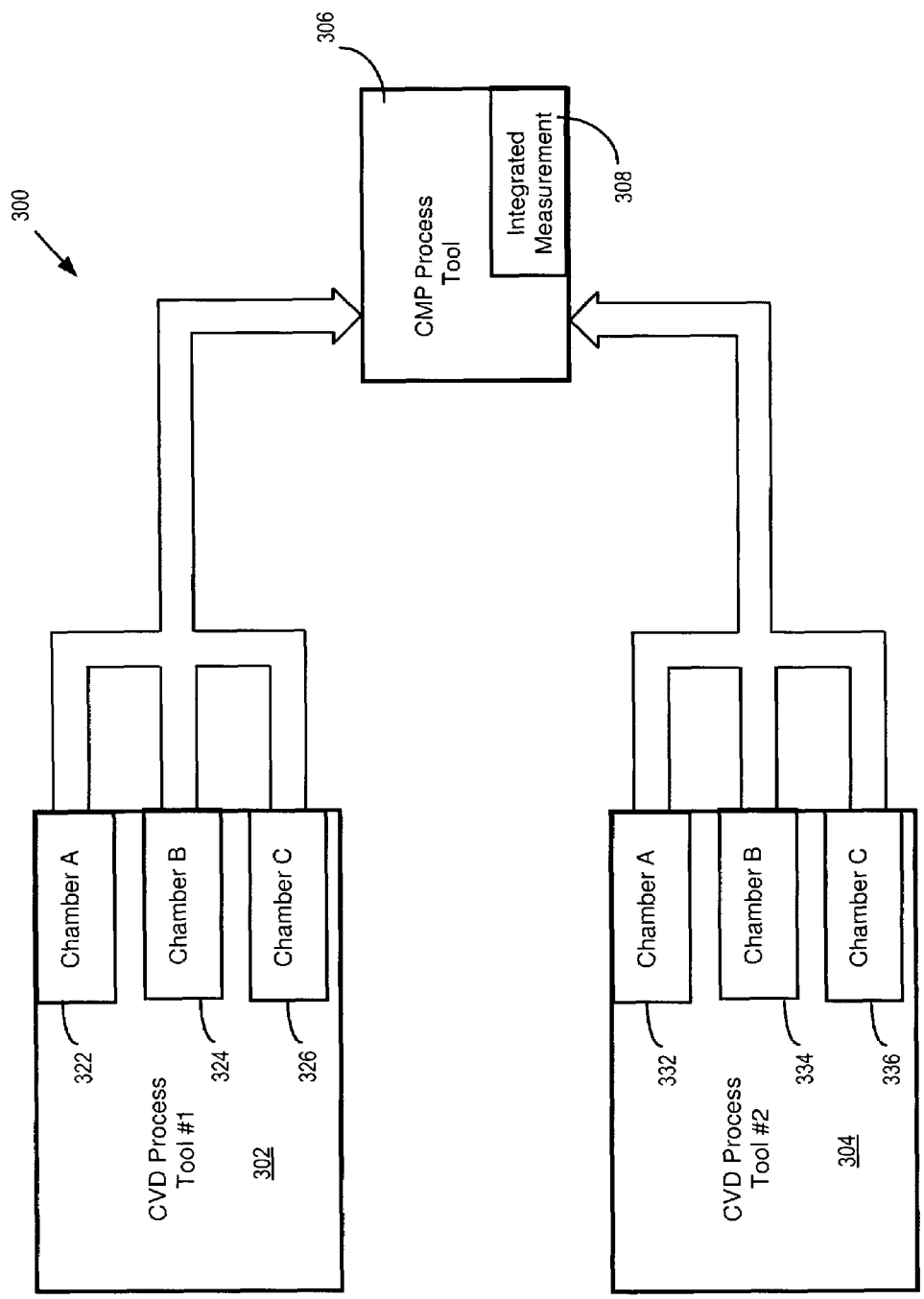

FIG. 3 shows an illustration of the concept of a deposition path.

Figure 4:
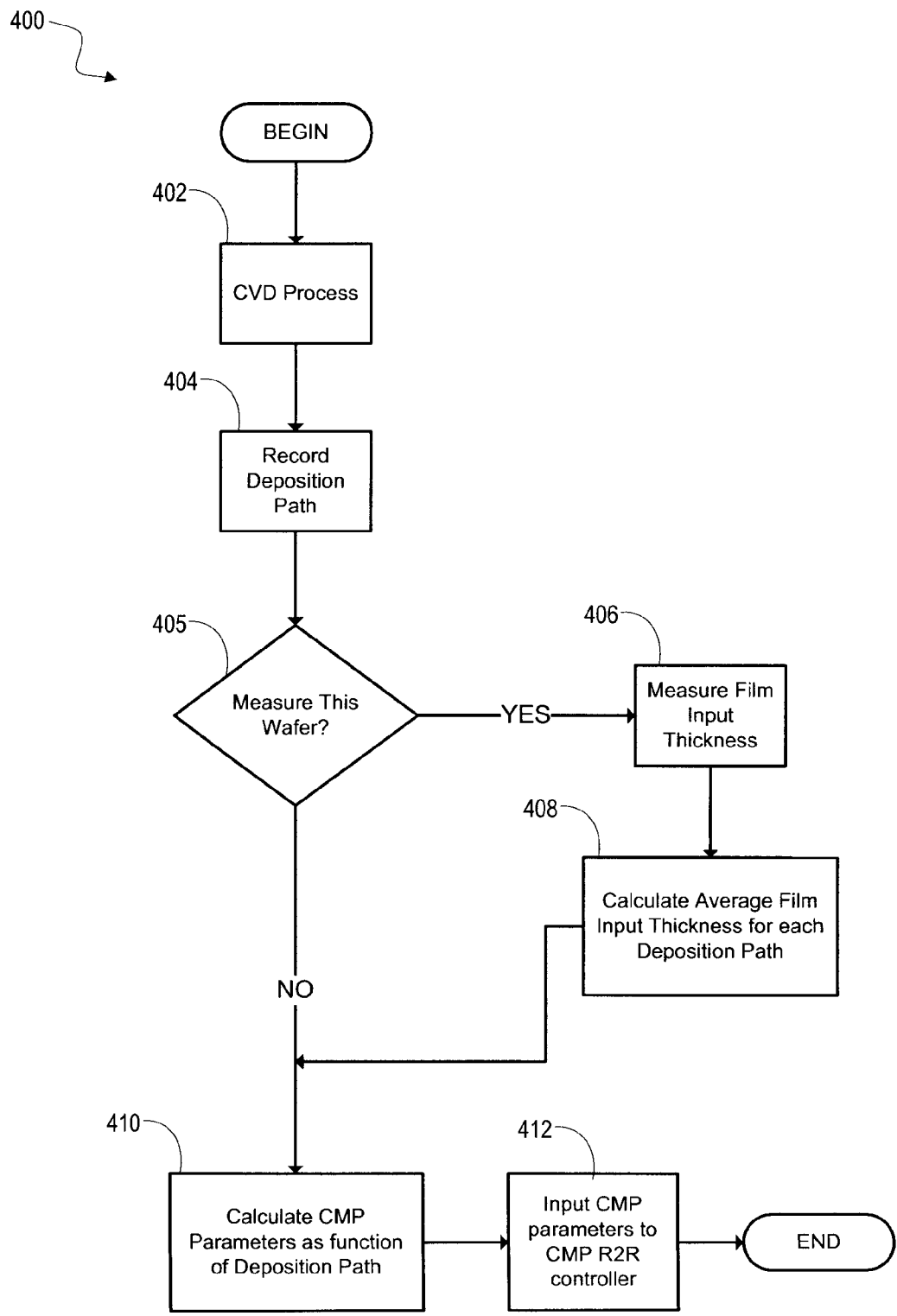

FIG. 4 shows a flowchart indicating steps to perform the method of the present invention.

DETAILED DESCRIPTION

With reference to the accompanying drawings, FIG. 2 shows a block diagram of the system 200 the present invention. The system 200 encompasses all of the elements of prior art system 100 of FIG. 1, with the addition of a CVD Data Processing System 216, and associated data communication links 230 and 232. The CVD Data Processing System 216 records the specific CVD Process Tool and chamber within that tool from which a particular semiconductor wafer originated. This information is sent to the CVD Data Processing System 216 from the CVD Process Tool 204 via data communication link 230. This will be shown in more detail in FIG. 3. The specific tool and chamber used to perform CVD on a given semiconductor wafer is referred to as a "deposition path." The CVD Data Processing System 216 provides deposition path specific data to the Data Management System 212 via data communication link 232. This data includes the deposition path specific data for each semiconductor wafer as it exits the CVD Process Tool 204. The Data Management System 212 then provides the CMP R2R Controller 214 with information regarding the deposition path of the next semiconductor wafer to enter CMP Process Tool 206 via data communication link 224.

Measurement device 210 performs measurements on semiconductor wafers that are fed to it via path W2. Data Management System 212 receives a film input thickness measurement on the semiconductor wafers that travel on path W2 from Measurement Tool 210 via data communication link 222, which is used by the CMP R2R controller 214 as a source of thickness data. A common way to perform this measurement is using standard metrology techniques including, but not limited to, electrical or optical methods that are known in the industry. However, another suitable measurement means may be used to perform a measurement within the scope of the present invention. The Data Management System 212 provides the input thickness measurements, and the associated deposition path data to the CMP R2R controller 214 via data communication link 224, which then computes an average input film thickness for each deposition path, and based on the average input film thickness, CMP R2R controller 214 then calculates updated values for various CMP Process Tool parameters, and sends the parameters to CMP Process Tool 206 via data communication link 228. Various embodiments may employ a "windowed average" where only the most recent pre-selected, i.e. X, number of samples are used in the average. For example, with a window size of 10, only the last 10 samples would be used to compute the average for each deposition path. Another alternative is to use a weighted average, where more weight is given to recent samples in calculating the average.

The CMP R2R Controller 214 tracks the deposition path of a given semiconductor wafer as it enters the CMP Process Tool 206 via path W1 or W3. The CMP R2R Controller 214 calculates a deposition path specific average film input thickness (DPSAFIT) based on input thickness data of various semiconductor wafer samples that is retrieved from Data Management System 212. The CMP R2R Controller 214 then uses the DPSAFIT as an input to calculate the recipe for the CMP Process Tool 206. In this way, intra-chamber, inter-chamber and inter-tool variations in the CVD process are considered in the average film input thickness that is used to derive the recipe for the CMP Process Tool 206.

CMP Process Tool 206 preferably has an integrated measurement module 208 to measure the final thickness of the film on a sampling of the semiconductor wafers. This final thickness data is provided to data management system 212 via data communication link 226, and may later be used by the CMP R2R controller 214 to control the manufacturing process, and make adjustments to the "recipe" as needed. The tool process recipe contains a list of parameters with values for a specific process operation. The parameters may include, but are not limited to, the polishing time, polishing rate, down force, slurry particle size, pH of the slurry, back pressure, and slurry flow rate of the CMP Process Tool 206. For example, based on the data from integrated measurement module 208, the data management system 212 can adjust the data sent to the CMP R2R controller 214 so that the final thickness of the film for semiconductor wafers moving through a specific deposition path can be increased or decreased, as needed.

While only one CVD Process Tool 204 is shown in FIG. 2, multiple CVD Process Tools can be connected to the CVD Data Processing System 216, and supply semiconductor wafers to the CMP Process Tool 206. With multiple CVD Process Tools, the manufacturing throughput can be increased, and the benefits of the DPSAFIT and method of the present invention have even greater benefit.

FIG. 3 shows multiple CVD Process Tools to illustrate the concept of an individual semiconductor wafer CVD process deposition path. System 300 with multiple CVD Tool Process Tools (302, 304) is shown. CMP Process Tool 306 having Integrated Measurement Module 308 is similar to CMP Process Tool 206 having Integrated Measurement Module 208 of FIG. 2 and can be substituted for CMP Process Tool 206 when multiple paths are desired. Each CVD Process Tool (302, 304) is similar to CVD Process Tool 204 of FIG. 2.

In FIG. 3, additional details of the chambers within each CVD Process Tool (302, 304), as compared with CVD Process Tool 204, are shown. For clarity, the measurement and data processing portions are not shown, as the purpose of this figure is simply to illustrate the concept of the deposition path. CVD Process Tool #1 (indicated by reference number 302) and CVD Process Tool #2 (indicated by reference number 304) both supply semiconductor wafers (not shown) to CMP Process Tool 306. In this exemplary embodiment, each CVD Process Tool (302, 304) has three chambers within it.

These chambers are denoted on the drawings as Chambers A, B, and C. For CVD Process Tool #1 (302), chamber A is indicated by reference number 322, chamber B is indicated by reference number 324, and chamber C is indicated by reference number 326. For CVD Process Tool #2 (304), chamber A is indicated by reference number 332, chamber B is indicated by reference number 334, and chamber C is indicated by reference number 336.

When a particular semiconductor wafer is input to CMP Process Tool 306, the deposition path of the semiconductor wafer is retrieved. For example, if a particular semiconductor wafer had a film deposited thereon in Chamber B (324) of CVD Process Tool #1 (302), then it would have a deposition path of "1-B." The deposition path uniquely specifies the chamber that was used to deposit a film on a particular semiconductor wafer. This information is then sent to CVD Data Processing System 216 (FIG. 2), and subsequently transferred to Data Management System 212 where it is then accessed by CMP R2R Controller 214.

FIG. 4 shows a flowchart 450 indicating process steps to perform the method of the present invention.

In process step 452, the CVD process is performed by a CVD process tool corresponding to CVD process tool 204 of FIG. 2 or CVD process tools 302 and 304 of FIG. 3. The CVD process tool applies a film to individual semiconductor wafers moving through specific deposition paths corresponding to specific chambers in the CVD process tools, as discussed hereinbefore.

Next, in process step 454, the deposition path for each semiconductor wafer is sent to the CVD Data Processing System 216 via data communication link 230 which records the specific CVD Process Tool and chamber within that tool from which each particular semiconductor wafer originated. The CVD Data Processing System 216 then provides deposition path specific data to the Data Management System 212 via data communication link 232. This data includes the deposition path specific data for each semiconductor wafer as it exits the CVD Process Tool 204. The Data Management System 212 then provides the CMP R2R Controller 214 with information regarding the deposition path of the next semiconductor wafer to enter CMP Process Tool 206 via data communication link 224.

Next, in process step 455, a check is performed by CVD Process Tool 204 in FIG. 2, to determine if the thickness of a given semiconductor wafer should be measured. This check typically involves maintaining a count of the output of wafers, and measuring a wafer if it is the Nth wafer in a sequence. Once a wafer is measured, the counter is reset, to repeat the process. In an exemplary embodiment, every $4^{th}$ semiconductor wafer is measured for each deposition path. Preferably, the thickness of a pre-selected number of semiconductor wafers will be measured. For semiconductor wafers that are not measured, the data of the deposition path is used to calculate the CMP Process Tool parameters (recipe) in process box 460, as described hereinafter. The semiconductor wafers that are not measured travel using path W1 of FIG. 2, and are directly input to CMP Process Tool 206. In a preferred embodiment, wafers are provided to CMP Process Tool 206 or Measurement Tool 210 in automatic fashion using robotic handling of semiconductor wafers as is well known in the art. In this case, signals from CMP Process Tool 206 interface to a control unit (not shown) that controls the robotic handling of semiconductor wafers, resulting in some wafers traveling via path W1, and other wafers traveling via path W2 and W3. Alternatively, semiconductor wafers may be provided to the various process tools (206, 210) manually, such as being transported in lots (e.g. stacked in cassettes) to the various process tools (206, 210).

For the semiconductor wafers that are selected to be measured, the film input thickness is measured in process step 456 by the Measurement device or tool 210 in FIG. 2. The film input thickness is the thickness of the film on the semiconductor wafer being input into the CMP Process Tool 206 (FIG. 2). The semiconductor wafers that are to be measured travel using path W2 of FIG. 2, and are input to the Measurement Tool 210. Once measurement is complete, those semiconductor wafers proceed to the CMP Process Tool 206 via path W3.

The data from process step 456 is sent to the Data Management System 212 of FIG. 2 via data communication link 222.

In process step 458, the deposition path specific average film input thickness (DPSAFIT) is calculated by the CMP R2R Controller 214 of FIG. 2 based on the input thickness measurements and the associated deposition path data from data management system 212.

In process step 460, the CMP Process Tool parameters (recipe) are calculated by the CMP R2R Controller 214 of FIG. 2 for semiconductor wafers according to their specific deposition path. That is, the recipe to be used for each semiconductor wafer passing through CMP Process Tool 206 (see FIG. 2) is calculated using the average film input thickness (that was calculated in process step 458) of the deposition path that corresponds to the semiconductor wafer that is undergoing CMP. If a semiconductor wafer going through the CMP Process Tool 206 was not measured in process step 456, then the parameters calculated in process step 460 are based on the most recently calculated DPSAFIT for the specific deposition path of that semiconductor wafer.

In process step 462, the parameters calculated in step 460 for each semiconductor wafer are passed to the CMP Process Tool 206 (FIG. 2) via data communication link 228.

In process step 464, each semiconductor wafer is processed via the CMP Process Tool 206 (FIG. 2) using the specific recipe calculated in process step 460. This processing comprises polishing the semiconductor wafer to reduce the input film thickness to its final thickness. An ideal goal of the semiconductor manufacturing process is that the final thickness is equal to the desired thickness.

In process step 466, the final thickness measured by the Integrated Measurement module 208 within CMP Process Tool 206 is sent to the Data Management System 212 via data communication link 228 (FIG. 2). The final thickness data may later be retrieved by the CMP R2R controller 214 from Data Management System 212 via data communication link 224 to control the manufacturing process, and make adjustments to the "recipe" as needed.

As can be seen from the preceding description, the present invention provides improved techniques for accommodating chemical vapor deposition process variation. It will be understood that the present invention may have various other embodiments. Furthermore, while the form of the invention herein shown and described constitutes a preferred embodiment of the invention, it is not intended to illustrate all possible forms thereof. For example, the CVD Data Processing System (216), Data Management System (212), and CMP R2R Controller (214) are shown as separate blocks in FIG. 2. However, an alternative embodiment of the present invention may incorporate the functionality of one or more of these blocks into a single device. For example, a CMP R2R Controller could incorporate the CVD Data Processing System functionality and Data Management System functionality, without departing from the scope of the present invention.

Furthermore, while various data communication links have been shown to illustrate a possible interconnection scheme, those skilled in the art will recognize that other network topologies are possible. Furthermore, data communication may be established wirelessly, without the use of physical connections, without departing from the scope of the present invention.

It will also be understood that the words used are words of description rather than limitation, and that various changes may be made without departing from the spirit and scope of the invention disclosed. Thus, the scope of the invention should be determined by the appended claims and their legal equivalents, rather than solely by the examples given.

What is claimed is:

1. A method for reducing the variation in film thickness on a plurality of semiconductor wafers having multiple deposition paths in a semiconductor manufacturing process, comprising the steps of:
   applying a film of a varying input thickness to the plurality of semiconductor wafers moving through a plurality of film deposition paths;
   recording the deposition path of each of the plurality of semiconductor wafers;
   measuring the input thickness of the film on selected semiconductor wafers passing through each of the plurality of film deposition paths;
   calculating an average film input thickness corresponding to each of the plurality of film deposition paths;
   calculating process tool parameters for each semiconductor wafer corresponding to the average film input thickness of the film deposition path of that semiconductor wafer; and
   reducing the input film thickness on each semiconductor wafer to its final film thickness corresponding to a desired film thickness using the process tool parameters calculated for that semiconductor wafer.

2. The method of claim 1, wherein the step of applying a film of a predetermined input thickness to the plurality of semiconductor wafers is with a CVD process tool having a plurality of film deposition paths.

3. The method of claim 2, wherein the step of applying a film is with one or more CVD process tools having a plurality of chambers, each representing a film deposition path, with different operating temperatures that cause variations in the input film thickness of the semiconductor wafers, depending on which chamber they were in when the film was deposited.

4. The method of claim 3, wherein the step of recording the deposition path includes recording the one or more CVD Process Tools and chamber within that tool from which a particular semiconductor wafer originated.

5. The method of claim 3, wherein the step of calculating process tool parameters is calculating chemical mechanical planarization process tool parameters for each semiconductor wafer.

6. The method of claim 5, wherein the step of reducing the input film thickness to final film thickness on each semiconductor wafer is performed by chemical planarization on each semiconductor wafer using a chemical mechanical planarization tool operated according to the calculated chemical mechanical planarization process tool parameter for that particular semiconductor wafer.

7. The method of claim 6, wherein the step of reducing the input film thickness to its final thickness on each semiconductor wafer is by polishing each semiconductor wafer using the chemical mechanical planarization process tool parameters for that particular semiconductor wafer.

8. The method of claim 1, wherein the step of measuring the thickness of the input film on selected semiconductor wafers passing through each of the plurality of film deposition paths includes sending the selected semiconductor wafers to a measurement tool.

9. The method of claim 1, wherein the step of recording the deposition path of the semiconductor wafer includes denoting a specific chemical vapor deposition tool, and a particular chamber within the specific chemical vapor deposition tool.

10. The method of claim 1, wherein the step of calculating an average film input thickness corresponding to each deposition path comprises calculating a windowed average based on the film input thickness of a last preselected number of semiconductor wafers.

11. The method of claim 1, wherein the step of calculating an average film input thickness corresponding to each deposition path comprises calculating a weighted average based on the film input thickness of a preselected number of semiconductor wafers and wherein a group of the semiconductor wafers closest to the last measured is more highly weighted in the average than the remainder of the preselected number of semiconductor wafers.

12. The method of claim 1, further comprising the steps of:
   measuring the final thickness; and
   calculating process tool parameters for each semiconductor wafer corresponding to the average film input thickness of the film deposition path of that semiconductor wafer and the final thickness for semiconductor wafers having the same film deposition path.

13. A system for reducing the variation in film thickness on a plurality of semiconductor wafers having multiple deposition paths in a semiconductor manufacturing process, comprising:
   at least one process tool for applying a film of a varying input thickness to the plurality of semiconductor wafers moving through a plurality of film deposition paths;
   a data processing system for recording the deposition path of each of the plurality of semiconductor wafers;
   a measurement device for measuring the input thickness of the film on selected semiconductor wafers passing through each of the plurality of film deposition paths;
   means for calculating an average film input thickness corresponding to each of the plurality of film deposition paths;
   means for calculating process tool parameters for each semiconductor wafer corresponding to the average film input thickness of the film deposition path of that semiconductor wafer; and
   means for reducing the input film thickness on each semiconductor wafer to its final film thickness corresponding to a desired film thickness using the process tool parameters calculated for that semiconductor wafer.

14. The system of claim 13 wherein the process tool for applying a film of a predetermined input thickness to the plurality of semiconductor wafers is with a CVD process tool having a plurality of film deposition paths.

15. The system of claim 14 wherein the CVD process tool has a plurality chambers, each representing a film deposition path, with different operating temperatures that cause variations in the input film thickness of the semiconductor wafers, depending on which chamber they were in when the film was deposited.

16. The system of claim 15 wherein the means for calculating process tool parameters is a chemical mechanical planarization run-to-run controller.

17. The system of claim 16 wherein the means for reducing the input film thickness to final film thickness on each semiconductor wafer is a chemical mechanical planarization tool operated according to a calculated chemical mechanical planarization process tool parameter for that particular semiconductor wafer.

18. The system of claim 17 wherein both the means for means for calculating an average film input thickness corresponding to each of the plurality of film deposition paths and the means for calculating process tool parameters for each semiconductor wafer corresponding to the average film input thickness of the film deposition path of that semiconductor wafer is the chemical mechanical planarization run-to-run controller.

19. The system of claim 17 wherein a means for recording a deposition path specific film input thickness comprises a data management system.

20. The system of claim 19, wherein the chemical mechanical planarization process tool has an integrated measurement module for measuring the final film thickness and sending the final film thickness to the data management system whereby the process tool parameters calculated for each semiconductor wafer corresponds to the average film input thickness of the film deposition path of that semiconductor wafer and the final thickness for semiconductor wafers having the same film deposition path.

* * * * *